(12) United States Patent
Hezar

(10) Patent No.: US 7,924,191 B2
(45) Date of Patent: Apr. 12, 2011

(54) INTEGRATED POLY-PHASE FIR FILTER IN DOUBLE-SAMPLED ANALOG TO DIGITAL CONVERTERS

(75) Inventor: Rahmi Hezar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 59 days.

(21) Appl. No.: 12/495,427

(22) Filed: Jun. 30, 2009

(65) Prior Publication Data

US 2010/0331039 A1    Dec. 30, 2010

(51) Int. Cl.
*H03M 3/00* (2006.01)
(52) U.S. Cl. ........................................ 341/143; 341/155
(58) Field of Classification Search .................. 341/143, 341/155, 156, 120, 126
See application file for complete search history.

(56) References Cited

U.S. PATENT DOCUMENTS

| | | | |
|---|---|---|---|
| 5,793,709 A * | 8/1998 | Carley | 368/113 |
| 6,239,729 B1 * | 5/2001 | Takeuchi | 341/100 |
| 6,532,370 B1 * | 3/2003 | Underbrink et al. | 455/552.1 |
| 2007/0025691 A1 * | 2/2007 | Shoji et al. | 386/83 |

OTHER PUBLICATIONS

Aziz, Pervez, et al.; "An Overview of Sigma-Delta Converters: how a 1-bit ADC achiees more than 16-bit resolution"; Department of Electrical & Systems Engineering, University of Pennsylvania, Year 1996; http://repository.upenn.edu/ese_papers/136; pp. 61-84 and coverpage.

* cited by examiner

*Primary Examiner* — Joseph Lauture
(74) *Attorney, Agent, or Firm* — John R. Pessetto; W. James Brady; Frederick J. Telecky, Jr.

(57) ABSTRACT

A sigma delta analog to digital converter includes a clock operating at a conversion clock rate and first and second conversion paths. The first path includes a first sigma delta modulator configured to produce from an input analog signal a first bit stream at the clock rate, and a first digital filter configured to decimate the first bit stream. The second conversion path has a second sigma delta modulator configured to produce from the input analog signal a second bit stream separate from the first bit stream at the clock rate, and a second digital filter configured to decimate the second bit stream.

12 Claims, 3 Drawing Sheets

Figure 1:
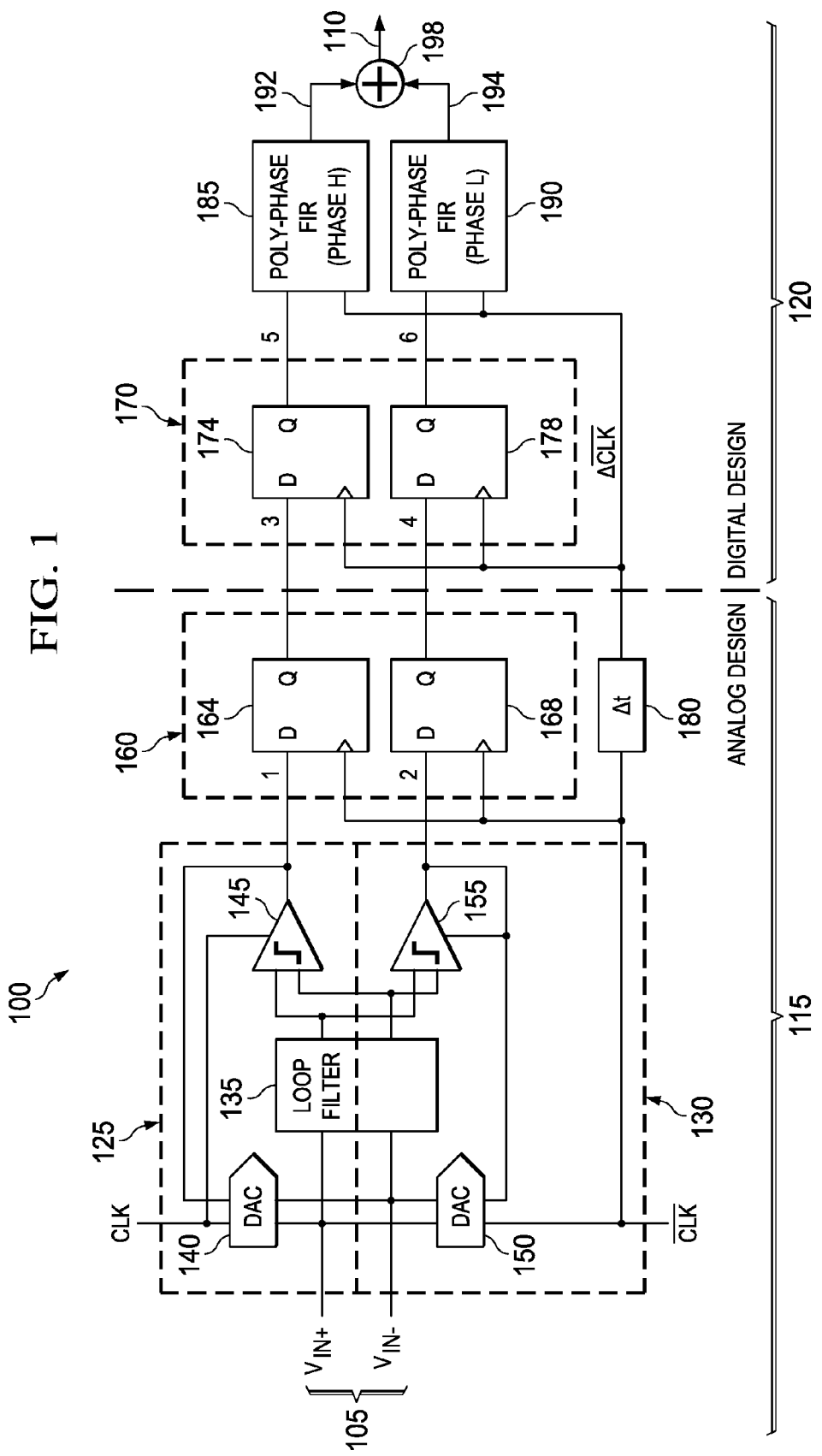

INTEGRATED POLY-PHASE FIR FILTER IN DOUBLE-SAMPLED ANALOG TO DIGITAL CONVERTERS

TECHNICAL FIELD

This application is directed, in general, to wireless communication and, more specifically, to an analog to digital converter and a method of operating an analog to digital converter.

BACKGROUND

In many applications a signal is converted from the analog domain to the digital domain. This allows processing of the signal in digital form in ways that are difficult or impossible to perform in the analog domain. The conversion is done by an analog to digital converter (ADC).

One technique of performing the conversion is sigma-delta modulation. This technique is often employed in applications requiring high resolution. An advantage of sigma-delta conversion is that the analog signal may be converted using only a 1-bit ADC, and analog processing circuits having a precision that may be much less than the resolution of the overall ADC.

SUMMARY

In one aspect, the disclosure provides a sigma delta analog to digital converter. In one embodiment, the converter includes a clock operating at a conversion clock rate, and first and second conversion paths. The first path includes a first sigma delta modulator configured to produce from an input analog signal a first bit stream at said clock rate, and a first digital filter configured to decimate the first bit stream. The second conversion path has a second sigma delta modulator configured to produce from the input analog signal a second bit stream separate from the first bit stream at the clock rate, and a second digital filter configured to decimate the second bit stream.

In another embodiment, a sigma delta converter includes an analog section that has a sigma delta modulator configured to produce from an input analog signal a first bit stream at a rate of a first clock signal. A first latch is configured to store and output each bit of the bit stream at a first phase of the clock signal. A delay element is configured to produce a delayed clock signal phase-delayed with respect to the first clock signal. The converter also includes a digital section that has a second latch configured to store each bit of the bit stream output by the first latch at a phase of the delayed clock signal. The bit stream is thereby synchronized with the delayed clock signal.

The disclosure also provides an embodiment of a mobile communication device. In this embodiment, the device includes a receiver configured to demodulate a received carrier signal. The device also includes an ADC configured to convert to the digital domain an analog signal recovered from the received carrier signal. The ADC includes a first conversion path that has a loop filter, a first sigma delta modulator, a first and a second flip-flop, and a first poly-phase filter. The loop filter is configured to accept a differential analog signal. The first sigma delta modulator includes a first digital to analog converter, the loop filter, and a first comparator configured to output a first bit stream at a rate of a conversion clock signal. The first bit stream represents the analog signal. A first flip-flop is configured to latch each bit of the first bit stream on an edge of the clock signal to produce a first latched bit stream. A second flip-flop is configured to latch each bit of the first latched bit stream on an edge of a delayed clock signal, delayed relative to said conversion clock signal, to produce a first synchronized bit stream. A first poly-phase filter is configured to produce a first decimated bit stream.

A second conversion path of the ADC includes a second sigma delta modulator. The second modulator includes a second digital to analog converter, the loop filter and a second comparator configured to output a second bit stream at the conversion rate. The second bit stream also represents the analog signal. A third flip-flop is configured to latch each bit of the second bit stream on the edge of the conversion clock signal to produce a second latched bit stream. A fourth flip-flop is configured to latch each bit of the second latched bit stream on the edge of the delayed clock signal to produce a second synchronized bit stream. A second poly-phase filter is configured to produce a second decimated bit stream.

BRIEF DESCRIPTION

Figure 2:
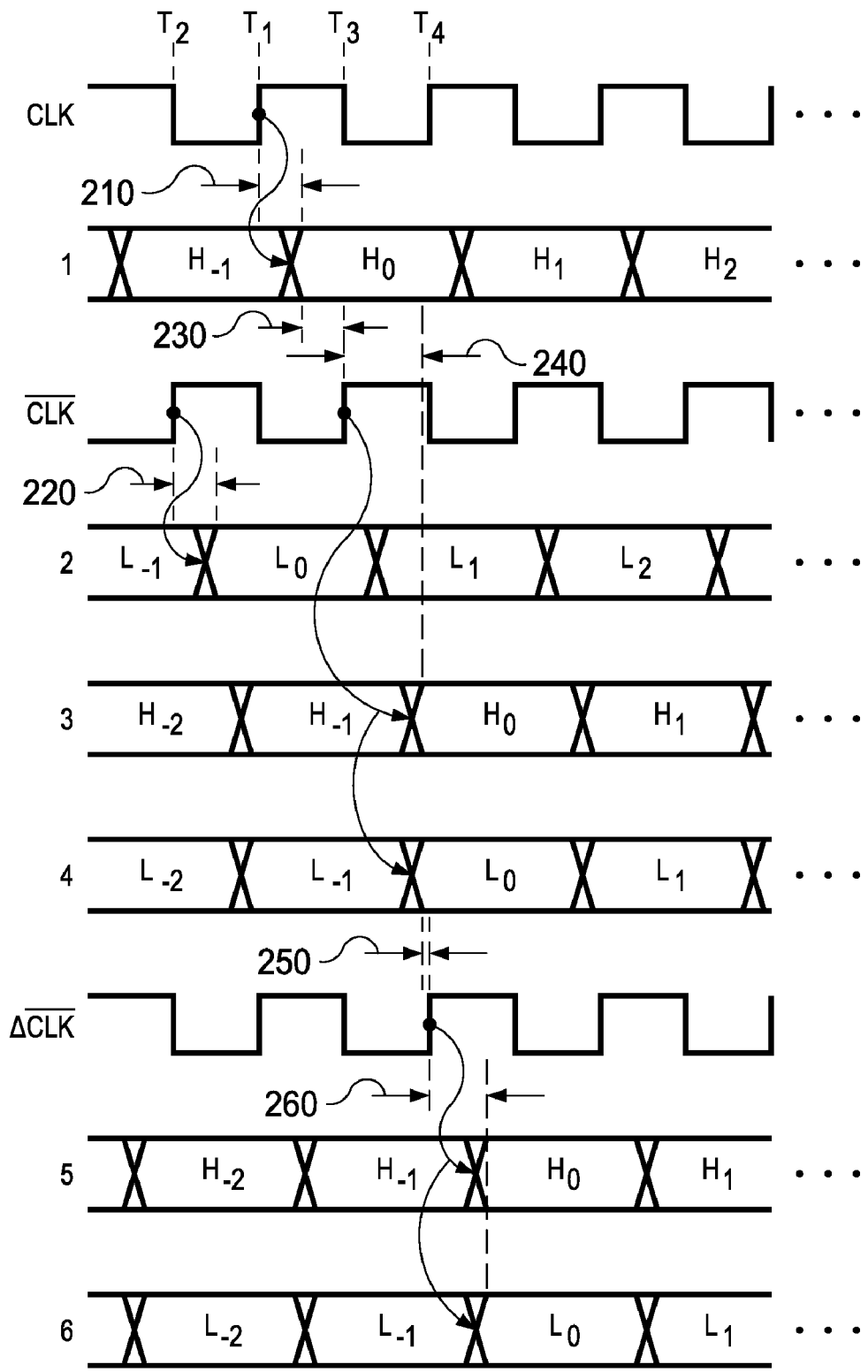
Figure 3:
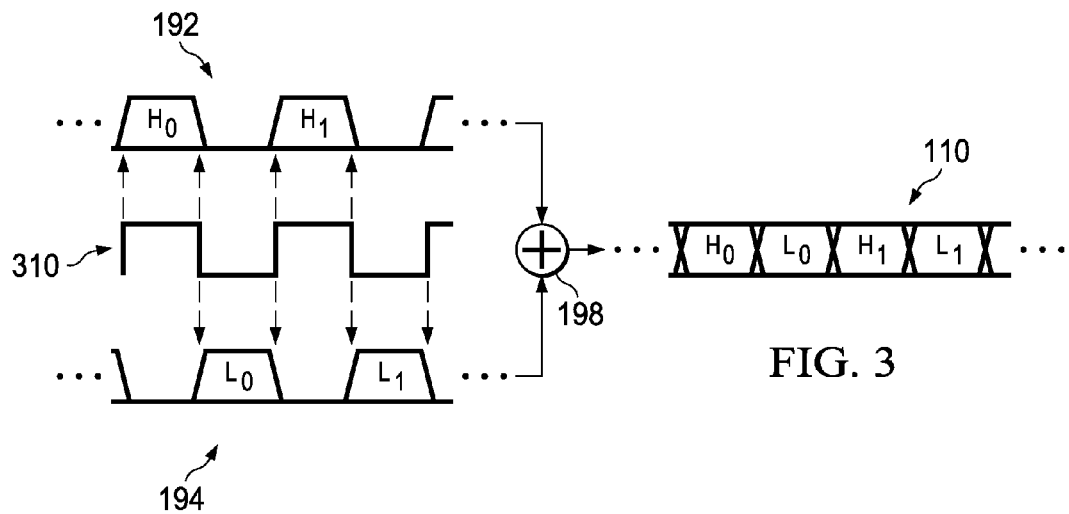
Figure 4:
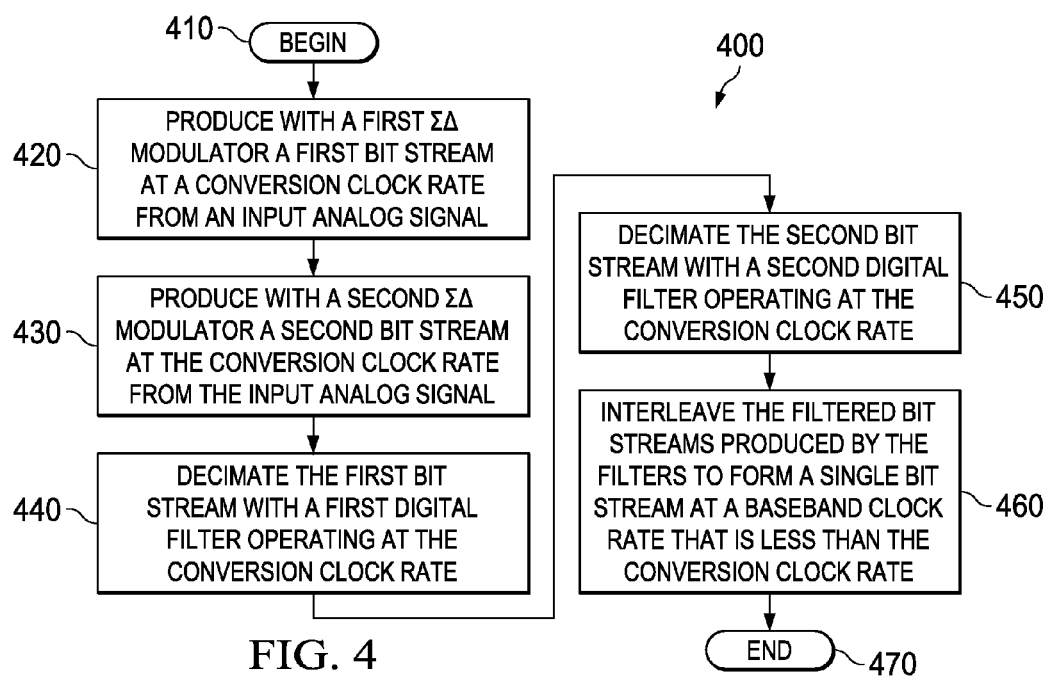
Figure 5:
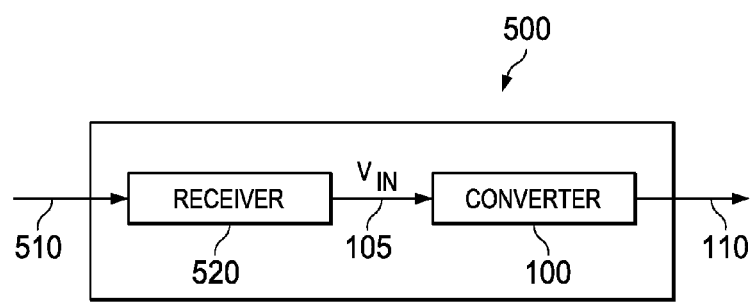

Reference is now made to the following descriptions taken in conjunction with the accompanying drawings, in which:

FIG. 1 illustrates an embodiment of the disclosure;
FIG. 2 is a timing diagram;
FIG. 3 illustrates interleaving bit streams;
FIG. 4 is a method; and
FIG. 5 illustrates a mobile communication device.

DETAILED DESCRIPTION

Embodiments of the disclosure reflect the recognition that deficiencies of conventional sigma delta analog converters can be overcome by employing a novel architecture of the converter that eliminates a doubled clock of conventional converters.

Some conventional sigma delta converters include two sigma delta (ΣΔ) modulators, each sampling an analog signal to be converted. (Hereinafter, a sigma delta converter is referred to as a "converter" or a "ΣΔ converter" for brevity.) Such a configuration is sometimes referred to as "double-sampling." In such designs, one ΣΔ modulator typically samples the analog input at one phase $\phi$ (phi) of a conversion clock, and the other modulator typically samples the analog input at another, typically opposite phase, e.g., $\phi+\pi$. Phi may be arbitrary, and is taken as zero for convenience in this disclosure unless stated otherwise.

Each ΣΔ modulator outputs a bit stream that represents the value of the analog signal at the clock period during which that modulator samples the signal. The bit stream of one modulator is typically interleaved with the bit stream of the other modulator to produce a combined bit stream with a bit rate twice that of the conversion clock.

The combined bit stream is conventionally latched by a flip-flop to synchronize the bit stream to a decimation filter running at twice the conversion clock rate. Conventionally, a 2× clock generator produces a 2× clock signal used to clock the flip-flop and the decimation filter.

In some cases, however, the timing of the 2× clock is not stable enough to reliably latch the bits of the interleaved bit stream. In some cases, e.g., the duty cycle of the conversion clock electrical signal when it reaches the 2× clock generator deviates significantly from 50%. The deviation may result in a 2× clock signal having irregularly spaced pulses, e.g., the period between adjacent pulse pairs may be different. The irregularly spaced pulses constitute jitter with respect to the rate that bits of the interleaved bit stream arrive at the latch.

This jitter mechanism makes a conventional ΣΔ converter sensitive to variations of process and operating voltage. For instance, a process condition or an operating voltage otherwise within an allowable range specified for a particular manufacturing process technology may result in jitter that exceeds the ability of the latch to reliably capture the bit stream data. Thus, when the jitter exceeds a threshold value, the conventional converter may fail to operate properly at process and voltage corners. Devices that include the conventional converter are typically tested at these corners prior to shipment. Those that fail to meet performance specifications at the corner values are then typically scrapped. In some cases, the scrap rate may exceed 20%. In an industry relentlessly driven to increase product yield, such a loss is unacceptable.

Typically, an analog designer who designs the analog section of the converter, e.g., the ΣΔ modulator and the flip-flop, is isolated from a digital designer who designs a digital section of the converter, such as the 2× clock generator and filter. A system-level specification may include signal requirements intended to provide a clean timing interface between the analog section and the digital section. In practice, designers often take such interface specifications for granted and focus on meeting the challenges of the particular module under design. The analog designer uses analog design techniques, including manual layout of components. The digital designer typically uses automated design tools that automatically place components and guarantee setup and hold times at component inputs. Guaranteeing such timing requirements is referred to as "closed timing."

The present disclosure recognizes for the first time a novel ΣΔ converter architecture that obviates the aforementioned issues related to jitter. The architecture reflects a design viewpoint that straddles the analog and digital sections of the ΣΔ converter, and thus provides an efficient, robust interface between these sections. Yield loss due to converter timing issues is advantageously reduced, and in some cases may be essentially eliminated.

FIG. 1 illustrates an embodiment of a converter 100 of the disclosure. The converter 100 receives an analog input signal 105 and outputs a serial digital signal 110 that represents the signal in the digital domain. The converter 100 includes an analog section 115 and a digital section 120. The analog section includes a first ΣΔ modulator 125, and a second SA modulator 130. The modulators 125, 130 may be conventional, but need not be. The modulator 125 includes a loop filter 135, a digital-to-analog converter (DAC) 140, and a 1-bit quantizer 145. The modulator 130 includes the loop filter 135, a DAC 150, and a 1-bit quantizer 155. The quantizers 145, 155 are illustrated without limitation as comparators, and are referred to as such hereinafter.

The input analog signal 105 is provided to differential inputs of the loop filter 135 via $V_{IN+}$ and $V_{IN-}$ signals. The loop filter 135 provides two outputs. The comparators 145, 155 each accept both outputs from the loop filter 135 and generate a digital signal in response. The output of the comparator 145 feeds back to one input of the DAC 140, and the output of the comparator 155 feeds back to one input of the DAC 150. The DAC 140 takes a conversion clock CLK at another input. The DAC 150 takes an inverted conversion clock $\overline{CLK}$ at another input. One output of each DAC 140, 150, and the $V_{IN+}$ signal are combined at a common node. Another output of each DAC 140, 150 and the $V_{IN-}$ signal are combined at another common node. Thus, two feedback loops are formed, one including the DAC 140, the loop filter 135, and the comparator 145, and the other including the DAC 150, the loop filter 135 and the comparator 155.

Each modulator 125, 130 samples $V_{IN}$ at the rate of the conversion clock, but at alternate phases of the clock. Thus, $V_{IN}$ is double-sampled. The modulator 125 samples $V_{IN}$ at one phase, e.g., when CLK is high, while the modulator 130 samples $V_{IN}$ at another phase, such as when CLK is low (equivalently when $\overline{CLK}$ is high). Accordingly, the output of the comparator 145 is referred to herein as the H bit stream, and the output of the comparator 155 is referred to herein as the L bit stream. Because the modulators 125, 130 operate at different phases of the conversion clock, the H and L bit streams are initially shifted in time relative to each other, e.g., by one half of a period of CLK. When the H bit stream and the L bit stream are down-sampled and combined, e.g., interleaved, as described below, the combined bit stream may be regarded as a pulse density modulated (PDM) representation of the time-varying $V_{IN}$ signal. The H bit stream is latched into a first latch 160 clocked by an edge of $\overline{CLK}$, which may be the rising edge. The L bit stream is also latched into the latch 160, thus phase-aligning the H and L bit streams. The latch 160 may include a first flip-flop 164 and a second flip-flop 168. The flip-flops 164, 168 are shown as D flip-flops, but any logic element configured to provide a latching function is within the scope of the disclosure. After a propagation time characteristic of the latch 160, the bits of each respective bit stream are valid at the outputs of the latch 160.

Those skilled in the art of analog design will appreciate that the analog section 115 is typically designed with minimal reliance on automated layout tools. Analog design is an inherently intuitive effort, reflecting the degree to which judgment and experience guide the designer of the analog circuitry. An analog designer may take into account several factors, such as coupling between components, parasitic feedback paths that lead to oscillation, and the wave character of high-frequency signals that may lead to differences of amplitude at different points on a signal path. The current state of automated analog layout is generally not sufficiently advanced to allow a more automated approach to analog design. Thus, the analog section 115 typically has a significant degree of non-automated design activity associated therewith.

The digital section 120, however, may include significant use of design automation. For example, a digital layout tool may place components appropriately to ensure closed timing of the digital section 120. The automated tool may take into account such parameters as process variation and operating voltage tolerance when determining a closed timing design. Devices that are manufactured and operated within the range of the parameters provided to the design tool are expected to operate properly within the described operating space. Accordingly, in some embodiments, the digital section 120 is designed to have closed timing.

A second latch 170 accepts at its inputs the H bit stream and the L bit stream from the latch 160. The latch 170 is illustrated without limitation including D flip-flops 174, 178. A delay element 180 provides a phase-delayed clock signal $\Delta\overline{CLK}$ to the digital section 120, including to the latch 170. The delay may take into account propagation time of the $\overline{CLK}$ signal from one region of an integrated circuit die to another region. In some embodiments, the delay element 180 is simply a signal trace, with propagation characteristics determined by the distributed RLC of the trace. In other embodiments, the delay element 180 includes one or more discrete elements, e.g., a resistor, capacitor or inductor, configured to provide a predetermined delay. With the interface determined by the designer to meet the timing requirements of the digital section 120, all further timing requirements may be guaranteed by virtue of the closed timing thereof.

The delay provided by the delay element 180 is determined by the analog designer to meet the setup and hold requirements of the flip-flops 174, 178. The delay element 180 accepts $\overline{CLK}$ at its input, applies a phase delay, and provides $\Delta\overline{CLK}$ with the selected phase delay. Generally, the phase delay is $2n\pi+\Delta\phi$, where n=0, 1, 2 . . . , and $\Delta\phi$ is a fraction of $2\pi$. In some embodiments, $\Delta\phi$ is about $\pi$, with an associated time shift $\Delta T$ of about one half of one period of CLK. The latch 170 may be configured to latch the data at its inputs at the same edge of the $\Delta\overline{CLK}$ as the latch 160 latches its inputs from the $\overline{CLK}$. Thus if the latch 160 latches the bits of the bit streams on each rising edge of the $\overline{CLK}$, the latch 170 may latch the bits presented to its inputs at each rising edge of the $\Delta\overline{CLK}$. In other embodiments, the latch 160 is clocked by the falling edge of the $\Delta\overline{CLK}$, as long as the setup and hold times of the latch 170 is met.

A first digital filter 185 receives the H bit stream, and a second digital filter 190 receives the L bit stream. The filter 185 performs a filtering function on the H bit stream to produce a filtered bit stream 192. The filter 190 performs a filtering function on the L bit stream to produce a filtered bit stream 194. The operation of the filters 185, 190 is described further below. A summing node 198 combines the filtered bit streams 192, 194 to produce the serial digital signal 110. This aspect is also described further below.

FIG. 2 illustrates a timing diagram 200 that represents the relationships of CLK, $\overline{CLK}$, and $\Delta\overline{CLK}$, and several nodes in FIG. 1 designated 1-6. In the following discussion, reference is made without limitation to the rising edge of the clock signals. Those of skill in the art understand that embodiments referenced to the falling clock edge are also within the scope of the disclosure.

At a time $T_1$, CLK has a rising edge. After a time interval 210, the signal at node 1, i.e., the bit output by the comparator 145, is valid. This bit is designated $H_0$, reflecting the fact that it is associated with the "high" phase of CLK. The interval 210 is determined substantially by analog design considerations related to the modulator 125. The interval 210 may be designed to be less than one CLK period. At a time $T_2$, $\overline{CLK}$ has a rising edge. After a time interval 220, the signal at node 2, i.e., the bit output by the comparator 155, is valid. This bit is designated $L_0$, reflecting the fact that it is associated with the "low" phase of CLK.

At a time $T_3$ the next rising edge of $\overline{CLK}$ latches the value at node 1 to node 3, and the value at node 2 to node 4. The analog section 115 is designed to guarantee that bit values at the inputs to the latch 160 meet setup and hold requirements, e.g., a setup period 230 and a hold period 240, of the latch 160. At a time T4, the $\Delta\overline{CLK}$ signal has a rising edge that clocks the latch 170, transferring the values at nodes 3 and 4 to nodes 5 and 6, respectively. Thus, the latches 160, 170 cooperate to synchronize the H bit stream and the L bit stream with the $\Delta\overline{CLK}$ signal. The phase delay $\Delta\overline{CLK}$ relative to $\overline{CLK}$ is selected to ensure that the data at nodes 3 and 4 meet the setup and hold requirements of the latch 170, e.g., a setup time 250 and a hold time 260. In the embodiment of FIG. 2, the time delay $\Delta T$ provided by the delay element 180 is about one half of a period of $\overline{CLK}$, or about $\pi$ radians. However, the phase delay is not limited to $\pi$, and may be any value determined to ensure that the setup and hold times of the latch 170 are met.

Thus, the analog section 115 interfaces robustly with the digital section 120. Because the latch 170 is driven by a clock running at the same frequency as the clock used to generate the two bit streams, there is substantially reduced jitter between the data arriving at the latch 170 inputs and the latching clock. Also, because $\Delta\overline{CLK}$ is derived from $\overline{CLK}$ by a passive phase delay, there is essentially no jitter between the clock inputs of the latch 160 and those of the latch 170. After the data are handed off to the digital section 120, the timing is guaranteed to be closed by automated layout tools.

However, unlike a conventional converter, the H bit stream and the L bit stream remain separate, e.g., not interleaved, at the interface between the analog section 115 and the digital section 120. Unlike a conventional converter, the separate H and L bit streams are filtered and down sampled (decimated) separately by the first digital filter 185 and the second digital filter 190, respectively. The separately filtered bit streams are then combined by the summing node 198 to form a baseband bit stream 110.

As appreciated by those of skill in the art, decimation is the function of reducing an incoming bit rate from a conversion clock rate to a slower baseband rate. The conversion clock rate and the baseband clock rate are related by a decimation factor. For example, the H and L bit streams may have a bit rate of about 500 MHz, while the baseband bit rate at the output of the node 198 of the combined H and L bit streams may be about 10 MHz. Thus, each filter may be configured to reduce the bit rate of its respective bit stream by a decimation factor of 100 to about 5 MHz. After the decimated bit streams are interleaved, the bit rate is 10 MHz. In some embodiments, the filters 185, 190 are configured to divide each input bit stream by two in a first decimation stage.

FIG. 3 illustrates interleaving of the bit streams 192, 194 by the summing node 198. The filtered H bit stream 192 is represented as $H_0, H_1, \ldots$, and the filtered L bit stream 194 is represented as $L_0, L_1, \ldots$. A baseband clock 310 is shown for reference. The clock 310 may have a frequency reduced from the conversion frequency by a decimation factor.

The H bit stream 192 includes bits phase-aligned with the positive, or high, phase of the clock 310. A bit with value 1 may be represented by a pulse with a width of about one half the period of the clock 310 and a bit with value 0 may be represented by the absence of a pulse during the high phase. The L bit stream 194 includes bits phase-aligned with the zero, or low, phase of the clock 310. Bits with value 0 or 1 are otherwise represented as are the bits of the H bit stream.

The summing node 198 combines the bit streams 192, 194 to produce the baseband bit stream 110. The bit stream 110 includes bits at each half-period of the clock 310, alternating between bits of the H bit stream 192 and the L bit stream 194. Thus, the H bit stream is interleaved with the L bit stream in the bit stream 110.

The filters 185, 190 may provide various filtering functions in addition to the decimation function. In some embodiments, the filters 185, 190 operate as low-pass filters. In some embodiments, the filters are finite impulse response (FIR) filters.

In some embodiments, the filter 185 is configured with coefficients that operate at one phase, e.g., "high" or 0 to $\pi$, of $\Delta\overline{CLK}$, while the filter 190 is configured with coefficients that operate at an opposite phase, e.g., "low" or $\pi$ to $2\pi$, of $\Delta\overline{CLK}$. A filter configured in this manner is referred to as a polyphase filter. The outputs of the filters 185, 190 may be easily interleaved by the summing node 198 configured, e.g., as a wired OR.

FIG. 4 illustrates a method of operating a $\Sigma\Delta$ converter. The method begins with a step 410. In a step 420, a first $\Sigma\Delta$ modulator produces from an input analog signal a first bit stream at a conversion clock rate. In a step 430, a second $\Sigma\Delta$ modulator produces from the input analog signal a second bit stream at the conversion clock rate. In a step 440, a first digital filter operates at the clock rate to decimate the first bit stream. In a step 450 a second digital filter operates at the clock rate to decimate the second bit stream. In a step 460 filtered bit streams produced by the filters are interleaved to form a single bit stream at a baseband clock rate that is less than the conversion clock rate. The method 400 ends with a step 470.

In some embodiments of the method 400, the first filter applies coefficients that are configured to operate at a first phase of the conversion clock, while the second filter applies coefficients configured to operate at a second, opposite phase of the conversion clock. In some embodiments, the decimated bit streams from the first and second filters are interleaved to form a single bit stream at the baseband frequency.

FIG. 5 illustrates an embodiment of a mobile communications device 500. The device 500 includes an input signal 510, a receiver 520, and the converter 100. The receiver 520, which may be conventional, is configured to recover an analog signal from the signal 510 to produce the $V_{IN}$ signal 105 to be converted. The converter 100 receives $V_{IN}$ 105, and is configured as described previously to convert $V_{IN}$ 105 to the baseband bit stream 110 as further described previously. The bit stream 110 may then be used within the device 500 as appropriate to the design thereof.

The device 500 may be any device configured to communicate with a transmitter (not shown) using a modulated carrier as the input signal 510. In various embodiments the carrier is an optical or RF signal. The transmitter may be a cellular base station configured to place the device 500 in communication with a network. Nonlimiting examples of the device 500 include a mobile station, a fixed or mobile subscriber unit, a pager, a cellular telephone, a personal digital assistant (PDA), and a computer equipped with a network card.

Those skilled in the art to which this application relates will appreciate that other and further additions, deletions, substitutions and modifications may be made to the described embodiments.

What is claimed is:

1. A sigma delta analog to digital converter, comprising:
a clock operating at a conversion clock rate;
a first conversion path including:
  a first sigma delta modulator configured to produce from an input analog signal a first bit stream at said clock rate, and
  a first digital filter configured to decimate said first bit stream; and
a second conversion path including:
  a second sigma delta modulator configured to produce from said input analog signal a second bit stream separate from said first bit stream at said clock rate, and
  a second digital filter configured to decimate said second bit stream;
a first latch and a second latch configured to synchronize the first and second bit streams with the clock;
wherein said second latch is configured to store each bit of said first and second bit streams about one half of a period of said clock rate after said first latch stores each bit.

2. A sigma delta analog to digital converter, comprising:
a clock operating at a conversion clock rate;
a first conversion path including:
  a first sigma delta modulator configured to produce from an input analog signal a first bit stream at said clock rate, and
  a first digital filter configured to decimate said first bit stream; and
a second conversion path including:
  a second sigma delta modulator configured to produce from said input analog signal a second bit stream separate from said first bit stream at said clock rate, and
  a second digital filter configured to decimate said second bit stream;
wherein said first digital filter is configured to apply filter coefficients that operate at a first phase of said conversion clock to produce a first decimated bit stream, and said second digital filter is configured to apply filter coefficients that operate at an opposite second phase of said conversion clock to produce a second decimated bit stream.

3. The converter as recited in claim 2, further comprising a summing node configured to interleave said first and said second decimated bit streams.

4. A sigma delta analog to digital converter, comprising:
an analog section including:
  a sigma delta modulator configured to produce from an input analog signal a first bit stream at a rate of a first clock signal,
  a first latch configured to store and output each bit of said bit stream at a phase of said first clock signal, and
  a delay element configured to produce a delayed clock signal phase-delayed with respect to said first clock signal; and
a digital section including:
  a second latch configured to store each bit of said bit stream output by said first latch at a phase of said delayed clock signal, thereby synchronizing said bit stream with said delayed clock signal;
wherein said analog section includes a second sigma delta modulator configured to produce from said input analog signal a second bit stream at said rate, wherein said first latch is further configured to store and output each bit of said second bit stream at said phase of said first clock signal, and said second latch is configured to store each bit of said second bit stream output by said first latch at said phase of said delayed clock signal.

5. The converter of claim 4, further comprising a first and a second digital filter, respectively configured to provide a low-pass filter function to said first and second bit streams.

6. The converter of claim 5, further comprising a summing node configured to interleave an output of said first filter and an output of said second filter.

7. A mobile communications device, comprising:
a receiver configured to demodulate a received carrier signal; and
an analog-to-digital converter configured to convert to the digital domain an analog signal recovered from the received carrier signal, the converter comprising:
a first conversion path including:
  a loop filter configured to accept a differential analog signal;
  a first sigma delta modulator including a first digital to analog converter, said loop filter and a first comparator configured to output a first bit stream at a rate of a conversion clock signal, said first bit stream representing said analog signal;
  a first flip-flop configured to latch each bit of said first bit stream on an edge of said clock signal to produce a first latched bit stream;
  a second flip-flop configured to latch each bit of said first latched bit stream on an edge of a delayed clock signal, delayed with respect to said conversion clock signal, to produce a first synchronized bit stream; and a first poly-phase filter configured to produce a first decimated bit stream, and a second conversion path including:

a second sigma delta modulator including a second digital to analog converter, said loop filter and a second comparator configured to output a second bit stream at said conversion rate, said second bit stream representing said analog signal;

a third flip-flop configured to latch each bit of said second bit stream on said edge of said conversion clock signal to produce a second latched bit stream;

a fourth flip-flop configured to latch each bit of said second latched bit stream on said edge of said delayed clock signal to produce a second synchronized bit stream; and a second poly-phase filter configured to produce a second decimated bit stream.

8. The device of claim 7, further comprising a delay line configured to delay said delayed clock signal by about one half of a period of said clock signal relative to said conversion clock signal.

9. The device of claim 7, further comprising a summing node configured to produce an interleaved baseband bit stream from said first and second filtered bit streams.

10. The device of claim 7, wherein said first and second poly-phase filters are configured to operate to provide a low-pass filter function for said first and second synchronized bit streams, respectively.

11. The device of claim 7, wherein said first and third flip-flops are configured to guarantee setup and hold times at data inputs of said second and fourth flip-flops, respectively.

12. The device of claim 7, wherein said mobile communication device is a cellular telephone.

* * * * *